(12) United States Patent
Kesari et al.

(10) Patent No.: US 6,884,338 B2
(45) Date of Patent: Apr. 26, 2005

(54) METHODS FOR POLISHING AND/OR CLEANING COPPER INTERCONNECTS AND/OR FILM AND COMPOSITIONS THEREFOR

(75) Inventors: Susrut Kesari, Santa Clara, CA (US); William M. Lamanna, Stillwater, MN (US); Michael J. Parent, Oakdale, MN (US); Lawrence A. Zazzera, Edina, MN (US)

(73) Assignee: 3M Innovative Properties Company, St. Paul, MN (US)

(*) Notice: Subject to any disclaimer, the term of this patent is extended or adjusted under 35 U.S.C. 154(b) by 256 days.

(21) Appl. No.: 10/319,954

(22) Filed: Dec. 16, 2002

(65) Prior Publication Data

US 2004/0112753 A1 Jun. 17, 2004

(51) Int. Cl.$^7$ .............................. C25F 3/00; C23G 1/00
(52) U.S. Cl. .............................. 205/640; 134/2; 134/3; 205/662; 205/674; 205/675; 205/676; 205/684; 205/705; 205/717; 205/721; 205/722; 205/723; 252/79.1; 252/79.2; 252/79.3; 252/79.4
(58) Field of Search ................................. 205/640, 662, 205/674, 675, 676, 684, 705, 717, 721, 722, 723; 134/2, 3; 252/79.1, 79.2, 79.3, 79.4

(56) References Cited

U.S. PATENT DOCUMENTS

| | | | |
|---|---|---|---|
| 5,652,072 A | 7/1997 | Lamanna et al. |
| 5,767,054 A | 6/1998 | Sprugel |
| 6,178,585 B1 | 1/2001 | Cadien et al. |
| 6,194,317 B1 | 2/2001 | Kaisaki et al. |
| 6,245,663 B1 | 6/2001 | Zhao et al. |
| 6,280,883 B1 | 8/2001 | Lamanna et al. |
| 6,284,656 B1 | 9/2001 | Farrar |
| 6,287,954 B1 | 9/2001 | Ashley et al. |
| 6,287,973 B1 | 9/2001 | Aoi |
| 6,287,977 B1 | 9/2001 | Hashim et al. |
| 6,290,578 B1 | 9/2001 | Bowman et al. |
| 6,290,833 B1 | 9/2001 | Chen |
| 6,291,082 B1 | 9/2001 | Lopatin |
| 6,291,333 B1 | 9/2001 | Lou |
| 6,291,887 B1 | 9/2001 | Wang et al. |
| 6,292,265 B1 | 9/2001 | Finarov et al. |
| 6,358,899 B1 | 3/2002 | Hackett |

FOREIGN PATENT DOCUMENTS

| | | |
|---|---|---|
| EP | 0 419 845 | 4/1991 |
| EP | 1 134 218 | 9/2001 |
| JP | 11-092754 | 6/1999 |
| WO | WO 99/30381 | 6/1999 |
| WO | WO 01/74985 A1 | 10/2001 |
| WO | WO 01/75955 A1 | 10/2001 |
| WO | WO 02/45142 | 6/2002 |
| WO | WO 02/092211 A2 | 11/2002 |

OTHER PUBLICATIONS

Article: Edelstein et al., "Copper Interconnect Technology in Semiconductor Manufacturing," *Electrochemical Society Proceedings vol. 99–9*, (date unknown but prior to filing date of present application), pp. 1–9.
Article: Braun, "Aluminum Persists as Copper Age Dawns," *Semiconductor International*, vol. 22, No. 9, Aug., 1999, pp. 58–60, 63, 64, & 66.
Article: Singer, "Dual–Damascene Challenges Dielectric Etch," *Semiconductor International*, vol. 22, No. 9, Aug., 1999, pp. 68–70 & 72.
Article: Braun, "Copper Metrology Gains Complexity, Capabilities," *Semiconductor International*, vol. 24, No. 10, Sep., 2001, pp. 56–58, 60, 64, & 70.
Article: Martyak et al., "Copper Sulfonate Electrolytes for Metallization of Interconnect Technology," American Electroplaters and Surface Finishing Conference, Chicago, IL Jun. 26, 2000, 15 pages.
PCT International Search Report, PCT/US03/34259, Mar. 23, 2004.

*Primary Examiner*—Robert R. Koehler

(57) ABSTRACT

The present invention provides methods of polishing and/or cleaning copper interconnects using bis (perfluoroalkanesulfonyl) imide acids or copper tris (perfluoroalkanesulfonyl) methide acids compositions.

58 Claims, No Drawings

METHODS FOR POLISHING AND/OR CLEANING COPPER INTERCONNECTS AND/OR FILM AND COMPOSITIONS THEREFOR

FIELD OF INVENTION

This invention relates to methods and compositions for the polishing and/or cleaning of copper interconnects and/or film. More particularly, this invention relates to methods for the polishing and/or cleaning of copper interconnects and/or film using compositions comprising at least one imide acid or at least one methide acid, and to these compositions.

BACKGROUND OF THE INVENTION

Integrated circuits are found in a variety of electronic and computer products. Integrated circuits are interconnected networks of electrical components formed on a common foundation or substrate. Manufacturers typically use techniques such as layering, doping, masking, and etching to build thousands and even millions of microscopic resistors, transistors, and other electrical components on a silicon wafer. These components are then wired, or interconnected, together to form a specific electric circuit, for example, a computer memory.

Typically, the components are covered with an insulating layer of silicon dioxide. Then, small holes are etched in the insulating layer to expose portions of the components underneath. Trenches are then dug in the layer to define a wiring pattern. Thus, millions of microscopic components are interconnected. Then, through metallization, the holes and trenches are filled to form sub-micron diameter wires between the components.

The semiconductor industry uses a damascene or dual damascene process to form the interconnects. The damascene process involves forming relief patterns in a dielectric layer (etching), filling the resulting pattern with interconnect metal, then polishing away the excess metal on the wafer surface and leaving inlaid interconnect metal features.

In each manufacturing step, it is often necessary or desirable to modify or refine an exposed surface of the wafer to prepare the wafer for subsequent manufacturing steps. There are several known polishing processes: chemical mechanical polishing (CMP), electrochemical mechanical deposition (ECMD), and chemical enhanced polishing (CEP), are examples. In addition, wafer cleaning is typically used. Each of these processes uses an aqueous acidic or basic solution or slurry. These solutions or slurries have been comprised of basic solutions for polishing the silicon dioxide interdielectric, and acidic solutions for polishing the conductive copper interconnect. Non-uniform polishing leading to dishing (or films that are not flat) is one challenge encountered during planarization. Other challenges include avoiding scratches on the surface of the flat films, and removing particles, residues, and metal ions leftover from the planarization process.

Aluminum has traditionally been used as the conductive interconnect material. In making high performance microprocessor chips, however, copper is now often used as an interconnect material. Copper is often preferred because of its low electrical resistivity, and its low resistance-capacitance (RC) time delays in the metal interconnect that limit the performance of high-speed logic chips.

Thus, the need exists for methods of polishing and/or cleaning copper interconnects and/or film that use a solution or a slurry having an acidic nature that effectively dissolves and/or removes copper. Additionally, the need exists for methods of polishing and/or cleaning copper interconnects and/or film that have little or no pitting and little or no increase in the roughness of the copper surface.

SUMMARY OF THE INVENTION

The present invention provides methods of polishing and/or cleaning of copper interconnects and/or film using solutions and/or slurries (i.e., compositions) comprising either imide acid or methide acid. Advantageously, the compositions of the present invention have an acidic nature that may effectively dissolve and/or remove copper and/or copper oxide. In an embodiment of the present invention, the compositions have an acidic nature that causes little or no pitting and little or no increase in the roughness of the copper surface. The compositions of the present invention are comprised of at least one perfluorinated imide acid, (bis(perfluoroalkanesulfonyl) imide acid; $HN(SO_2C_nF_{2n+1})_2$) or at least one perfluorinated methide acid (tris (perfluoroalkanesulfonyl) methide acid; $HC(SO_2C_nF_{2n+1})_3$) and solvent.

In one aspect, the present invention is a method of polishing a copper interconnect and/or film comprising the steps of:

a) providing a composition comprising or consisting essentially of:

i) at least one weight percent of at least one bis (perfluoroalkanesulfonyl) imide acid represented by the formula:

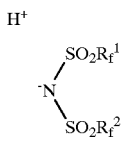

wherein each $R_f$ is independently a perfluorinated alkyl group comprising 1 to 12 carbon atoms that may be cyclic or acyclic, may optionally contain catenated ("in-chain") or terminal heteroatoms selected from the group consisting of N, O, and S (e.g., $-SF_4-$ and $-SF_5$), and any two $R_f$ groups may be linked to form a perfluoroalkylene-containing ring; and ii) solvent;

b) providing a substrate comprising at least one surface having at least one copper interconnect and/or film;

c) bringing the surface of the substrate and the composition into contact with each other to form an interface; and d) applying a force to promote copper dissolution at the interface.

Optionally, one or more additive(s) may be added to the composition.

Another embodiment of the present invention is a method of polishing a copper interconnect and/or film comprising the steps of:

a) providing a composition comprising or consisting essentially of:

i) at least one tris(perfluoroalkanesulfonyl) methide acid represented by the formula:

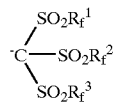

wherein each $R_f$ is independently a perfluorinated alkyl group comprising 1 to 8 carbon atoms that may be cyclic or acyclic, may optionally contain catenated or terminal heteroatoms selected from the group consisting of N, O, and S (e.g., —SF$_4$— and —SF$_5$), and any two $R_f$ groups may be linked to form a perfluoroalkylene-containing ring; and ii) solvent;

b) providing a substrate comprising at least one surface having at least one copper interconnect and/or film;

c) bringing the surface of the substrate and the composition into contact with each other to form an interface; and d) applying a force to promote copper dissolution at the interface.

Optionally, one or more additive(s) may be added to the composition.

Another embodiment of the present invention is a method of cleaning a copper interconnect and/or film comprising the steps of:

a) providing a composition comprising or consisting essentially of:

i) at least one weight percent of at least one bis(perfluoroalkanesulfonyl) imide acid represented by the formula

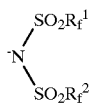

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring; and ii) solvent;

b) providing a substrate comprising at least one surface having at least one copper interconnect and/or film, the copper interconnect and/or film having at least one unwanted material on the surface;

c) bringing the surface of the substrate and the composition into contact with each other to form an interface; and d) allowing removal of unwanted surface material.

This method may further comprise the step of applying a force to promote copper dissolution at the interface.

Optionally, one or more additive(s) may be added to the composition.

In yet another embodiment, the present invention is a method of cleaning copper interconnects and/or film comprising the steps of:

a) providing a composition comprising or consisting essentially of:

i) at least one tris(perfluoroalkanesulfonyl) methide acid represented by the formula

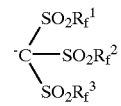

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring; and ii) solvent;

b) providing a substrate comprising at least one surface having at least one copper interconnect and/or film, the copper interconnect and/or film having at least one unwanted material on the surface;

c) bringing the surface of the substrate and the composition into contact with each other to form an interface; and d) allowing removal of unwanted surface material.

This method may further comprise the step of applying a force to promote copper dissolution at the interface.

Optionally, one or more additive(s) may be added to the composition.

In yet another embodiment, the present invention is a method of electrochemical mechanical deposition (ECMD) comprising the steps of:

a) providing a composition comprising or consisting essentially of:

i) at least one weight percent of at least one bis(perfluoroalkanesulfonyl) imide acid represented by the formula

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring;

ii) solvent; and iii) copper salt;

b) providing a conductive substrate;

c) bringing the conductive substrate and the composition into contact with each other; and d) applying an electrochemical potential and a force to promote copper deposition and copper polishing.

Optionally, one or more additive(s) may be added to the composition.

In yet another embodiment, the present invention is a method of electrochemical mechanical deposition (ECMD) comprising the steps of:

a) providing a composition comprising or consisting essentially of:

i) at least one tris(perfluoroalkanesulfonyl) methide acid represented by the formula:

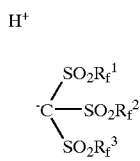

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring;

ii) solvent; and iii) copper salt;

b) providing a conductive substrate;

c) bringing the conductive substrate and the composition into contact with each other; and d) applying an electrochemical potential and a force to promote copper deposition and copper polishing.

Optionally, one or more additive(s) may be added to the composition.

In another aspect, the present invention is a composition comprising or consisting essentially of:

a) at least one weight percent of at least one bis(perfluoroalkanesulfonyl) imide acid represented by the formula

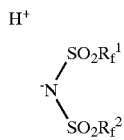

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring;

b) solvent; and c) oxidizing agent.

In yet another aspect, the present invention is a composition comprising or consisting essentially of:

a) at least one tris(perfluoroalkanesulfonyl) methide acid represented by the formula:

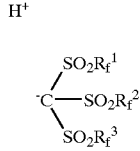

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring; and b) solvent; and c) oxidizing agent.

DETAILED DESCRIPTION OF ILLUSTRATIVE EMBODIMENTS

The present invention relates to methods for cleaning and/or polishing copper interconnects and/or film using compositions having at least one imide acid or at least one methide acid and solvent. Compositions of the present invention comprise both solutions and slurries. A solution is defined herein as a homogeneous mixture. A slurry is defined herein as a suspension of particles in a solution. A copper interconnect is defined herein as a surface pattern comprising copper. A film is defined herein as a thin coating of copper on a substrate such as a silicon wafer.

The solvent may be a polar organic solvent or water.

Optionally, other additives, including abrasives, other acids, oxidizing agents, corrosion inhibitors, chelating agents, electrolytes, brighteners, surfactants, leveling agents, etc. can also be added to the composition depending on the method.

The present invention also provides methods for polishing copper interconnects and/or film, methods for cleaning copper interconnects and/or film, and methods for ECMD.

In one embodiment, the compositions of the present invention comprise or consist essentially of at least one imide acid or at least one methide acid, solvent, and oxidizing agent. The compositions of the present invention may also comprise or consist essentially of at least one imide acid or at least one methide acid, solvent, and one or more additive(s).

Imide Acids

The imide acids of the present invention include bis(perfluoroalkanesulfonyl) imide acids. These acids can be represented by the following formula:

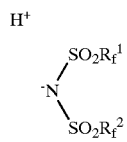

where $R_f^1$ and $R_f^2$ are independently a perfluoroalkyl group containing from 1 to 12 carbon atoms, optionally containing catenated or terminal heteroatoms such as O, N, and S (e.g., —$SF_4$— or $SF_5$) within or at the end of the carbon chain. $R_f^1$ and $R_f^2$ preferably contain from 1 to 4 carbon atoms and more preferably contain from 1 to 2 carbon atoms. Each $R_f$ group may independently be cyclic or acyclic. The $R_f$ groups may also be linked to form a perfluoroalkylene-containing ring.

Bis(perfluoroalkanesulfonyl) imides may be prepared from perfluoroalkanesulfonyl halides by methods which are well known in the art and described in U.S. Pat. Nos. 5,874,616, 5,723,664, and ZA 9804155. Generally, these anions can be prepared by reacting 2 moles of $R_fSO_2X$ (where X is a halide such as —F or —Cl) with $NH_3$ in the presence of $Et_3N$ (or a similar base) or by reacting $R_fSO_2X$ with $R_fSO_2NH_2$ in the presence of $Et_3N$ (or a similar base). Additionally, solutions of bis(perfluoroalkanesulfonyl) imide salts, such as $Li[N(SO_2CF_3)_2]$, (HQ™ 115, available from 3M Company, St. Paul, Minn.), can be acidified with strong acids to yield bis(perfluoroalkanesulfonyl) imide acids by distillation.

Examples of suitable anions of the present invention include, but are not limited to:

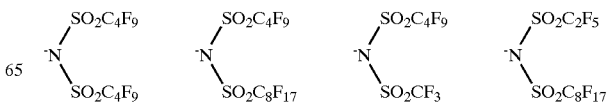

-continued

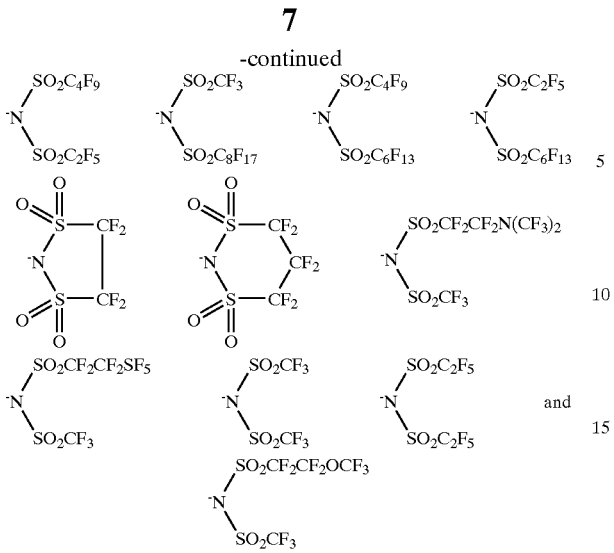

Preferably, the anion is

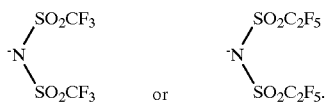

The imide acid is typically present in the composition in at least one weight percent. A particularly suitable composition may have at least about 30 weight percent or at least about 50 weight percent imide acid. The imide acid may be added to about 70 weight percent.

Methide Acids

The methide acids of the present invention are perfluorinated. These acids can be represented by the following formula:

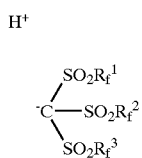

wherein $R_f^1$, $R_f^2$, and $R_f^3$ are independently a perfluorinated alkyl group that may be cyclic or acyclic, and may optionally contain catenated or terminal heteroatoms such as N, O, and S (e.g., —$SF_4$— or —$SF_5$) within or at the end of the carbon chain. Any two $R_f$ groups may be linked to form a perfluoroalkylene-containing ring. Each $R_f$ independently has from 1 to 8 carbon atoms, preferably 1 to 4 carbon atoms.

Examples of suitable anions include, but are not limited to,

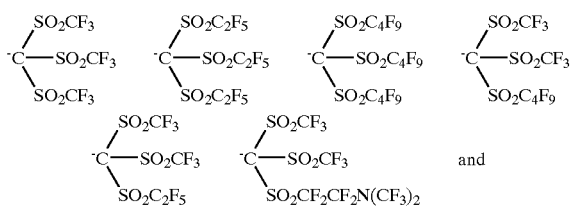

-continued

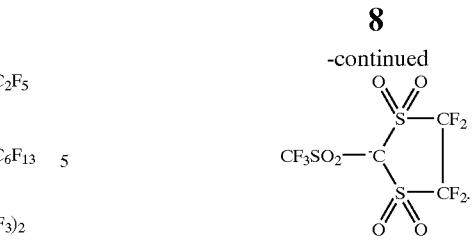

The preparation of perfluorinated methide anions is described in U.S. Pat. Nos. 5,446,134, 5,273,840, 5,554,664, 5,514,493, and in Turowsky & Seppelt, Inorg. Chem., 27, 2135–2137 (1988).

The methide acid is typically present in the composition in at least one weight percent. A particularly suitable composition may have at least about 30 weight percent or at least about 50 weight percent methide acid. The methide acid may be added to about 70 weight percent.

Solvent

The solvent of the present invention is water, a polar organic solvent, or a mixture thereof. A polar solvent is defined herein as having a dielectric constant greater than 5 at room temperature. Examples of suitable polar organic solvents include, but are not limited to, esters such as methyl formate, ethyl formate, methyl acetate, dimethyl carbonate, diethyl carbonate, propylene carbonate, ethylene carbonate, and butyrolactones (e.g., gamma butyrolactone); nitriles such as acetonitrile and benzonitrile; nitro compounds such as nitromethane or nitrobenzene; amides such as N,N-dimethylformamide, N,N-diethylformamide, and N-methylpyrrolidinone; sulfoxides such as dimethyl sulfoxide; sulfones such as dimethylsulfone, tetramethylene sulfone, and other sulfolanes; oxazolidinones such as N-methyl-2-oxazolidinone and mixtures thereof.

A particularly suitable solvent is water, and in particular de-ionized water. A preferred polar organic solvent is acetonitrile Optional Additives In some embodiments of the present invention, one or more optional additive(s) may be added to the composition. These additives include, but are not limited to, additives selected from the group consisting of oxidizing agents (e.g., $HNO_3$, $H_2O_2$, $O_3$, $Fe(NO_3)_3$, etc.), abrasive particles, other acids (e.g., $H_2SO_4$, dilute aqueous HF, HCl), corrosion inhibitors (e.g., benzotriazoles, tolyltriazole (TTA)), chelating agents (e.g., ammonium citrate, iminodiacetic acid (IDA), EDTA), electrolytes (e.g., ammonium hydrogen phosphate), surfactants, brighteners, levelers, etc. Typically these additives are present in a concentration ranging from 10 to 100,000 ppm.

For polishing applications, typically the compositions of the present invention either comprise abrasive particles or are used in combination with a fixed abrasive. Suitable abrasive particles include, but are not limited to, alumina, silica, and/or cerium oxide. Generally abrasive particles are present in a concentration ranging from about 3 to about 10 wt. %. Fixed abrasives typically are abrasive particles fixed in a polymer.

For ECMD applications, the compositions of the present invention further comprise a copper salt, which may be any copper salt that is soluble in the solvent (i.e., typically the concentration of the copper cation is at least 0.10 M in the solvent). Suitable copper salts include, but are not limited to, copper imides, copper methides, copper organo-sulfonates, copper sulfates, or mixtures thereof. Copper salts are typically present in a concentration ranging from about 0.10 M to about 1.5 M in the solvent.

Method for Preparing the Compositions

The compositions of the present invention may be prepared by at least partially dissolving or dispersing the imide acid or the methide acid in solvent, preferably de-ionized water.

The imide acid or methide acid is generally employed at a concentration such that the rate of copper dissolution can be readily controlled.

Methods

The compositions of the present invention are particularly useful for polishing and/or cleaning copper interconnects and/or film. Examples of polishing include, but are not limited to, chemical mechanical polishing (CMP), chemical enhanced polishing (CEP), and electrochemical mechanical deposition (ECMD). Examples of cleaning include, but are not limited to, wafer cleaning.

The present invention provides a method for polishing copper interconnects and/or film comprising the steps of:

a) providing a composition comprising or consisting essentially of:

i) at least one weight percent of at least one bis(perfluoroalkanesulfonyl) imide acid represented by the formula:

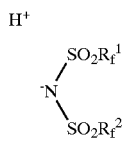

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring; and ii) solvent;

b) providing a substrate comprising at least one surface having at least one copper interconnect and/or film;

c) bringing the surface of the substrate and the composition into contact with each other to form an interface; and d) applying a force to promote copper dissolution at the interface.

Optionally, one or more additive(s) may be added to the composition.

Another embodiment is a method of polishing a copper interconnect and/or film comprising the steps of:

a) providing a composition comprising or consisting essentially of:

i) at least one tris(perfluoroalkanesulfonyl) methide acid represented by the formula:

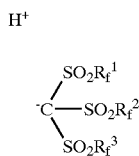

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring; and ii) solvent;

b) providing a substrate comprising at least one surface having at least one copper interconnect and/or film;

c) bringing the surface of the substrate and the composition into contact with each other to form an interface; and d) applying a force to promote copper dissolution at the interface.

Optionally, one or more additive(s) may be added to the composition.

The composition and the substrate may be brought into contact with each other using known methods. For example, the composition may be sprayed onto the copper-containing substrate, or alternatively the copper-containing substrate may be dipped into a "bath" of the composition.

The force applied in step (d) may be either mechanical or electrochemical, or both.

Optionally, the copper dissolution (or corrosion) process may be reversed by applying an electrochemical potential to the copper coating or pattern sufficient to cause the copper ions in solution to replate. This process can be useful in controlling the rate and effectiveness of the copper polishing process.

Another embodiment of the present invention is a method of cleaning a copper interconnect and/or film comprising the steps of:

a) providing a composition comprising or consisting essentially of:

i) at least one weight percent of at least one bis(perfluoroalkanesulfonyl) imide acid represented by the formula

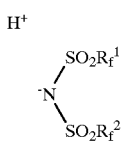

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring; and ii) solvent;

b) providing a substrate comprising at least one surface having at least one copper interconnect and/or film, the copper interconnect and/or film having at least one unwanted material on the surface;

c) bringing the surface of the substrate and the composition into contact with each other to form an interface; and d) allowing removal of unwanted surface material.

This method may further comprise the step of applying a force to promote copper dissolution at the interface.

Optionally, one or more additive(s) may be added to the composition.

The present invention also provides a method for cleaning a copper interconnect and/or film comprising the steps of:

a) providing a composition comprising or consisting essentially of:

i) at least one tris(perfluoroalkanesulfonyl) methide acid represented by the formula

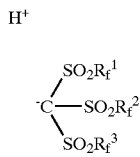

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring; and ii) solvent;

b) providing a substrate comprising at least one surface having at least one copper interconnect and/or film, the copper interconnect and/or film having at least one unwanted material on the surface;

c) bringing the surface of the substrate and the composition into contact with each other to form an interface; and d) allowing removal of unwanted surface material.

Optionally, one or more additive(s) may be added to the composition.

The unwanted materials include, but are not limited to, residues, films, and contaminants including copper oxide.

In yet another embodiment, the present invention is a method of electrochemical mechanical deposition (ECMD) comprising the steps of:

a) providing a composition comprising or consisting essentially of:

i) at least one weight percent of at least one bis(perfluoroalkanesulfonyl) imide acid represented by the formula

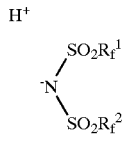

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring;

ii) solvent; and iii) copper salt;

b) providing a conductive substrate;

c) bringing the conductive substrate and the composition into contact with each other; and d) applying an electrochemical potential and a force to promote copper deposition and copper polishing.

Optionally, one or more additive(s) may be added to the composition.

In yet another embodiment, the present invention is a method of electrochemical mechanical deposition (ECMD) comprising the steps of:

a) providing a composition comprising or consisting essentially of:

i) at least one tris(perfluoroalkanesulfonyl) methide acid represented by the formula:

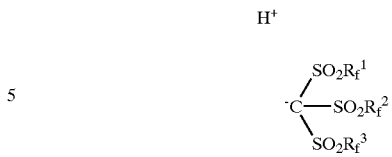

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring;

ii) solvent; and iii) copper salt;

b) providing a conductive substrate;

c) bringing the conductive substrate and the composition into contact with each other; and d) applying an electrochemical potential and a force to promote copper deposition and copper polishing.

Optionally, one or more additive(s) may be added to the composition.

The application of an electrochemical potential and a force in step d) of the ECMD methods may be simultaneous or alternating.

Suitable substrates of the present invention include, but are not limited to, a silicon or GaAs wafer coated with thin films of various compositions including metals, conductive polymers, and insulating materials.

The copper-containing substrate and the composition typically are brought into contact by immersion, spray, or spin dispense.

EXAMPLES

The present invention will be further described with reference to the following non-limiting examples and test methods. All parts, percentages, and ratios are by weight unless otherwise specified.

Test Methods

Test Method 1. Etch rate of copper determined by Inductively Coupled Plasma/Atomic Emission Spectrometry (ICP/AES) analysis.

In a 100 mL beaker was placed copper foil coupons (0.25 $in^2$, (1.6 $cm^2$)) and 50 mL of the acid composition to be tested. The copper coupon and composition was stirred for 1 hour, then the copper foil was removed and the concentration of Cu in the solution was determined by ICP/AES using a Perkin-Elmer Optima 3300 DV ICP (using standards of 0, 0.1, 1 ppm in 0.2% $H_2SO_4$). This is a measure of the amount of copper that is etched from the surface of the coupon and dissolved into solution.

Test Method 2. Etch rate of copper determined by electrochemical impedance.

Electrochemical impedance analysis was used as an alternative method to measure the etch rate of copper in the various acid solutions (1.75 M). A cell equipped with a 3 mm flat disc copper working electrode, a platinum mesh counter electrode, and a Ag/AgCl reference electrode was used for all measurements. The Cu electrode was polished using an alumina slurry and thoroughly rinsed with de-ionized water before each analysis. All measurements were taken at the open circuit potential. Use of an equivalent circuit model and least-squares fitting allowed for the determination of the resistance to charge transfer (Rct) for each acid solution.

Test Method 3. This test method qualitatively measures the character of the copper etched in acids by using scanning electron microscopy. Samples were cut from Silicon wafers (4 inch diameter; 10 cm.) with sputtered copper films (5000 Angstroms thick). An Hitachi S4500 Field Emission Scanning Electron Microscope (FESEM; available from Hitachi Co., Japan) was used for the analysis (30,000× magnification) of the samples before treatment. These same samples were then washed with acetone to remove any debris that was introduced during the analysis, and immersed in the appropriate aqueous acid composition (1.75 M) to be tested for 10 minutes, under mild agitation. The samples were then rinsed with de-ionized water and re-analyzed using FESEM. All testing was completed within 24 hours.

Preparation of $HN(SO_2CF_3)_2$ Solution

A 50% aqueous solution of $Li[N(SO_2CF_3)_2]$ (available from 3M Company, St Paul, Minn.) was placed in glass dishes and dried overnight in an oven at 120° C. This dried material (2276.6 g) was placed in a 5 L, three-necked round-bottom flask equipped with a magnetic stir bar and distillation head. Sulfuric acid (98%; 4482.2 g) was then slowly added to the flask. Upon completion of the addition, the flask was then heated and distillates were collected in a receiving flask at a temperature of 105° C. and pressure of 75 mm Hg (10 kPa). The first fraction was collected (84.4 g) and then a second fraction was collected under the same conditions. The second fraction yielded a clear solid (HN$(SO_2CF_3)_2$ (1981 g; 88.9% yield; mp 40° C.). A 1.75 M aqueous solution was prepared from this material using de-ionized water.

Example 1 and Comparative Example C1

Etch Rate of Copper Using Test Method 1

The copper etch rate (ppm/in$^2$) was determined using Test Method 1 for the acid solutions listed in Table 1.

TABLE 1

| Ex | Acid Solution | Cu Concentration ppm/in$^2$ (ppm/cm$^2$) |
|---|---|---|
| 1 | $HN(SO_2CF_3)_2$ (1.75 M) | 6332.6 (981.6) |
| C1 | $H_2SO_4$ (1.75 M) | 2859.1 (443.2) |

The data in Table 1 indicate that $HN(SO_2CF_3)_2$ etches copper at a faster rate than the Comparative Example C1 using $H_2SO_4$.

Example 2 and Comparative Example 2

Etch Rate of Copper Using Test Method 2

The copper etch rate was determined using Test Method 2. The resulting resistance to charge transfer (Rct) values are listed in Table 2.

TABLE 2

| Ex | Acid Solution | Rct (kOhm) |
|---|---|---|
| 2 | $HN(SO_2CF_3)_2$ (1.75 M) | 5.5 |
| C2 | $H_2SO_4$ (1.75 M) | 15.4 |

The data in Table 2 show that $HN(SO_2CF_3)_2$ solutions had lower resistance to charge transfer values, indicating that the corrosion rate of copper was faster in the solution of $HN(SO_2CF_3)_2$ than the Comparative Example C2 using $H_2SO_4$.

Qualitative Analysis Using Test Method 3

Comparing the SEM images before and after immersion in 1.75 M acid, the following conclusions were made.

(1) Less pitting of the copper films was observed with $HN(SO_2CF_3)_2$, than with $H_2SO_4$. Pitting of the copper films after treatment with $H_2SO_4$ showed pits of average size of about 50 nm (0.05 um). The average size of the pits on all the untreated control surfaces and surfaces exposed to $HN(SO_2CF_3)_2$ were <50 nm (<0.05 um).

(2) The copper films exposed to the $H_2SO_4$ had more poorly defined grain boundaries. The copper films exposed to $HN(SO_2CF_3)_2$ had better defined grain boundaries.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims as set forth herein as follows.

What is claimed is:

1. A method of polishing a copper interconnect and/or film comprising the steps of:
   a) providing a composition comprising:
      i) at least one weight percent of at least one bis (perfluoroalkanesulfonyl) imide acid represented by the formula:

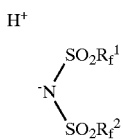

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring; and
      ii) solvent;
   b) providing a substrate comprising at least one surface having at least one copper interconnect and/or film;
   c) bringing the surface of the substrate and the composition into contact with each other to form an interface; and
   d) applying a force to promote copper dissolution at the interface.

2. The method according to claim 1, wherein said composition further comprises
   iii) one or more additive(s).

3. The method according to claim 2, wherein the one or more additive(s) is selected from the group consisting of abrasive particles, other acids, oxidizing agents, etchants, corrosion inhibitors, chelating agents, electrolytes, surfactants, brighteners, and levelers.

4. The method according to claim 1, wherein said solvent is water.

5. The method according to claim 1, wherein $R_f^1$ and $R_f^2$ independently comprise from 1 to 4 carbon atoms.

6. The method according to claim 1, wherein said bis (perfluoroalkanesulfonyl) imide is selected from the group consisting of:

$$\begin{array}{c}
\text{N}\diagup\text{SO}_2\text{C}_4\text{F}_9\diagdown\text{SO}_2\text{C}_4\text{F}_9
\end{array}$$

$$\text{N}(\text{SO}_2\text{C}_4\text{F}_9)(\text{SO}_2\text{C}_8\text{F}_{17})$$

$$\text{N}(\text{SO}_2\text{C}_4\text{F}_9)(\text{SO}_2\text{CF}_3)$$

$$\text{N}(\text{SO}_2\text{C}_2\text{F}_5)(\text{SO}_2\text{C}_8\text{F}_{17})$$

$$\text{N}(\text{SO}_2\text{C}_4\text{F}_9)(\text{SO}_2\text{C}_2\text{F}_5)$$

$$\text{N}(\text{SO}_2\text{CF}_3)(\text{SO}_2\text{C}_8\text{F}_{17})$$

$$\text{N}(\text{SO}_2\text{C}_4\text{F}_9)(\text{SO}_2\text{C}_6\text{F}_{13})$$

$$\text{N}(\text{SO}_2\text{C}_2\text{F}_5)(\text{SO}_2\text{C}_6\text{F}_{13})$$

$$\text{N}(\text{SO}_2\text{CF}_3)(\text{SO}_2\text{CF}_3)$$

$$\text{N}(\text{SO}_2\text{C}_2\text{F}_5)(\text{SO}_2\text{C}_2\text{F}_5)$$

and $$\text{N}(\text{SO}_2\text{CF}_2\text{CF}_2\text{OCF}_3)(\text{SO}_2\text{CF}_3).$$

7. The method according to claim 1, wherein the imide acid is present at a concentration of at least about 30 weight percent of the composition.

8. The method according to claim 1, wherein the imide acid is present at a concentration of at least about 50 weight percent of the composition.

9. The method according to claim 1, wherein the imide acid is present at a concentration of up to about 70 weight percent of the composition.

10. A method of polishing a copper interconnect and/or film comprising the steps of:
a) providing a composition comprising:
i) at least one tris(perfluoroalkanesulfonyl) methide acid represented by the formula:

$$\text{H}^+$$
$$\text{C}(\text{SO}_2\text{R}_f^1)(\text{SO}_2\text{R}_f^2)(\text{SO}_2\text{R}_f^3)$$

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring; and
ii) solvent;
b) providing a substrate comprising at least one surface having at least one copper interconnect and/or film;
c) bringing the surface of the substrate and the composition into contact with each other to form an interface; and
d) applying a force to promote copper dissolution at the interface.

11. The method according to claim 10, wherein said composition further comprises
iii) one or more additive(s).

12. The method according to claim 11, wherein the one or more additive is selected from the group consisting of abrasive particles, other acids, oxidizing agents, etchants, corrosion inhibitors, chelating agents, electrolytes, surfactants, brighteners, and levelers.

13. The method according to claim 10, wherein said solvent is water.

14. The method according to claim 10, wherein $R_f^1$, $R_f^2$, and $R_f^3$ independently comprise from 1 to 4 carbon atoms.

15. The method according to claim 10, wherein said tris(perfluoroalkanesulfonyl) methide is selected from the group consisting of:

$$\text{C}(\text{SO}_2\text{CF}_3)_3$$
$$\text{C}(\text{SO}_2\text{C}_2\text{F}_5)_3$$
$$\text{C}(\text{SO}_2\text{C}_4\text{F}_9)_3$$
$$\text{C}(\text{SO}_2\text{CF}_3)_2(\text{SO}_2\text{C}_4\text{F}_9)$$
$$\text{C}(\text{SO}_2\text{CF}_3)_2(\text{SO}_2\text{C}_2\text{F}_5)$$
$$\text{C}(\text{SO}_2\text{CF}_3)_2(\text{SO}_2\text{CF}_2\text{CF}_2\text{N}(\text{CF}_3)_2)$$

and $$\text{CF}_3\text{SO}_2-\text{C}(\text{SO}_2\text{CF}_2\text{CF}_2\text{SO}_2)\text{ (ring)}$$

16. The method according to claim 10, wherein the methide acid is present at a concentration of at least one weight percent of the composition.

17. The method according to claim 10, wherein the methide acid is present at a concentration of at least about 30 weight percent of the composition.

18. The method according to claim 10, wherein the methide acid is present at a concentration of at least about 50 weight percent of the composition.

19. The method according to claim 10, wherein the methide acid is present at a concentration of up to about 70 weight percent of the composition.

20. A method of cleaning a copper interconnect and/or film comprising the steps of:
a) providing a composition comprising:
i) at least one weight percent of at least one bis(perfluoroalkanesulfonyl) imide acid represented by the formula $$\text{H}^+$$
$$\text{N}(\text{SO}_2\text{R}_f^1)(\text{SO}_2\text{R}_f^2)$$

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring; and
ii) solvent;
b) providing a substrate comprising at least one surface having at least one copper interconnect and/or film, the copper interconnect and/or film having at least one unwanted material on the surface;
c) bringing the surface of the substrate and the composition into contact with each other to form an interface; and
d) allowing removal of unwanted surface material.

21. The method according to claim 20, wherein said composition further comprises
iii) one or more additive(s).

22. The method according to claim 21, wherein the one or more additive(s) is selected from the group consisting of abrasive particles, other acids, oxidizing agents, etchants, corrosion inhibitors, chelating agents, electrolytes, surfactants, brighteners, and levelers.

23. The method according to claim 20, wherein said solvent is water.

24. The method according to claim 20, wherein $R_f^1$ and $R_f^2$ independently comprise from 1 to 4 carbon atoms.

25. The method according to claim 20, wherein said bis(perfluoroalkanesulfonyl) imide is selected from the group consisting of:

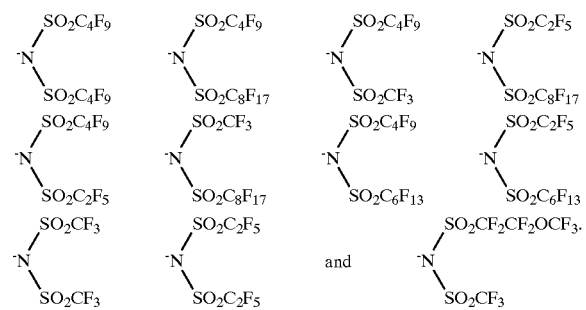

26. The method according to claim 20, wherein the imide acid is present at a concentration of at least about 30 weight percent of the composition.

27. The method according to claim 20, wherein the imide acid is present at a concentration of at least about 50 weight percent of the composition.

28. The method according to claim 20, further comprising the step of
   d) applying a force to promote copper dissolution at the interface.

29. The method according to claim 28, wherein said force is mechanical, electrochemical, or a mixture thereof.

30. A method of cleaning copper interconnects and/or film comprising the steps of:
   a) providing a composition comprising:
      i) at least one tris(perfluoroalkanesulfonyl) methide acid represented by the formula

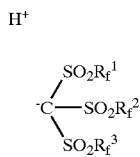

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring; and
      ii) solvent;
   b) providing a substrate comprising at least one surface having at least one copper interconnect and/or film, the copper interconnect and/or film having at least one unwanted material on the surface;
   c) bringing the surface of the substrate and the composition into contact with each other to form an interface; and
   d) allowing removal of unwanted surface material.

31. The method according to claim 30, wherein said composition further comprises
   iii) one or more additive(s).

32. The method according to claim 31, wherein the one or more additive is selected from the group consisting of abrasive particles, other acids, oxidizing agents, etchants, corrosion inhibitors, chelating agents, electrolytes, surfactants, brighteners, and levelers.

33. The method according to claim 30, wherein said solvent is water.

34. The method according to claim 30, wherein $R_f^1$, $R_f^2$, and $R_f^3$ independently comprise from 1 to 4 carbon atoms.

35. The method according to claim 30, wherein said tris(perfluoroalkanesulfonyl) methide is selected from the group consisting of:

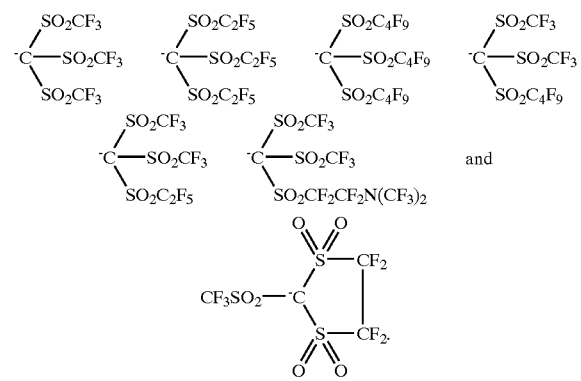

36. The method according to claim 30, wherein the methide acid is present at a concentration of at least one weight percent of the composition.

37. The method according to claim 30, wherein the methide acid is present at a concentration of at least about 30 weight percent of the composition.

38. The method according to claim 30, wherein the methide acid is present at a concentration of at least about 50 weight percent of the composition.

39. The method according to claim 30, wherein the methide acid is present at a concentration of up to about 70 weight percent of the composition.

40. The method according to claim 30, further comprising the step of
   d) applying a force to promote copper dissolution at the interface.

41. The method according to claim 40, wherein said force is mechanical, electrochemical or a mixture thereof.

42. A method of electrochemical mechanical deposition comprising the steps of:
   a) providing a composition comprising:
      i) at least one weight percent of at least one bis (perfluoroalkanesulfonyl) imide acid represented by the formula

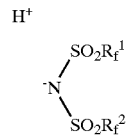

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene-containing ring;
      ii) solvent; and
      iii) copper salt;

b) providing a conductive substrate;
c) bringing the conductive substrate and the composition into contact with each other; and
d) applying an electrochemical potential and a force to promote copper deposition and copper polishing.

43. The method according to claim 42, wherein said composition further comprises
   iv) one or more additive(s).

44. The method according to claim 43, wherein the one or more additive is selected from the group consisting of abrasive particles, other acids, oxidizing agents, etchants, corrosion inhibitors, chelating agents, electrolytes, surfactants, brighteners, and levelers.

45. The method according to claim 42, wherein $R_f^1$ and $R_f^2$ independently comprise from 1 to 12 carbon atoms.

46. The method according to claim 42, wherein said bis(perfluoroalkanesulfonyl) imide is selected from the group consisting of:

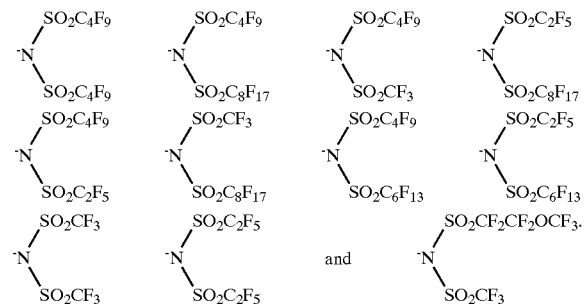

47. The method according to claim 42, wherein the imide acid is present at a concentration of at least about 30 weight percent of the composition.

48. A method of electrochemical mechanical deposition comprising the steps of:
   a) providing a composition comprising:
      i) at least one tris(perfluoroalkanesulfonyl) methide acid represented by the formula:

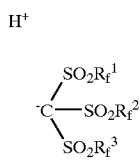

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring;
      ii) solvent; and
      iii) copper salt;
   b) providing a conductive substrate;
   c) bringing the conductive substrate and the composition into contact with each other; and
   d) applying an electrochemical potential and a force to promote copper deposition and copper polishing.

49. The method according to claim 48, wherein said composition further comprises
   iv) one or more additive(s).

50. The method according to claim 49, wherein said one or more additive is selected from the group consisting of abrasive particles, other acids, oxidizing agents, etchants, corrosion inhibitors, chelating agents, electrolytes, surfactants, brighteners, and levelers.

51. The method according to claim 48, wherein $R_f^1$, $R_f^2$, and $R_f^3$ independently comprise from 1 to 4 carbon atoms.

52. The method according to claim 48, wherein said tris(perfluoroalkanesulfonyl) methide is selected from the group consisting of:

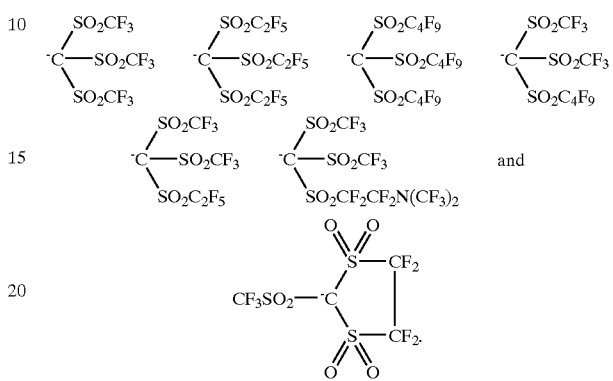

53. The method according to claim 48, wherein the methide acid is present at a concentration of at least one weight percent.

54. The method according to claim 48, wherein the methide acid is present at a concentration of at least about 30 weight percent of the composition.

55. A composition comprising:
   a) at least one weight percent of at least one bis(perfluoroalkanesulfonyl) imide acid represented by the formula

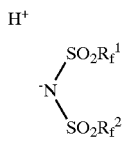

wherein each $R_f$ is independently a perfluorinated alkyl group comprising 1 to 12 carbon atoms that may be cyclic or acyclic, may optionally contain catenated or terminal heteroatoms selected from the group consisting of N, O, and S, and any two $R_f$ groups may be linked to form a perfluoroalkylene containing ring;
   b) solvent; and
   c) oxidizing agent.

56. The composition according to claim 55, wherein said oxidizing agent is selected from the group consisting of $HNO_3$, $H_2O_2$, $Fe(NO_3)_3$, $O_3$ and mixtures thereof.

57. A composition comprising:
   a) at least one tris(perfluoroalkanesulfonyl) methide acid represented by the formula:

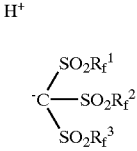

wherein each $R_f$ is independently a perfluorinated alkyl group comprising 1 to 8 carbon atoms that may be cyclic or acyclic, may optionally contain catenated or terminal heteroatoms selected from the group consisting of N, O, and S, and any two $R_f$ groups may be linked to form a perfluoroalkylene-containing ring;

b) solvent; and c) oxidizing agent.

58. The composition according to claim 57, wherein said oxidizing agent is selected from the group consisting of $HNO_3$, $H_2O_2$, $Fe(NO_3)_3$, $O_3$ and mixtures thereof.

* * * * *